United States Patent [19]
Roberts

[11] Patent Number: 5,835,050
[45] Date of Patent: Nov. 10, 1998

[54] MULTI-RANGE ANALOG-TO-DIGITAL CONVERTER WITH MULTI-RANGE SWITCHING

[75] Inventor: Keith M. Roberts, Nyack, N.Y.

[73] Assignee: LeCroy Corporation, Chestnut Ridge, N.Y.

[21] Appl. No.: 735,928

[22] Filed: Oct. 23, 1996

Related U.S. Application Data

[60] Provisional application No. 60/006,215, Nov. 3, 1995.

[51] Int. Cl.⁶ .................................................. H03M 1/12
[52] U.S. Cl. ..................... 341/172; 341/139; 341/141; 341/155; 341/166
[58] Field of Search .................................. 341/172, 139, 341/141, 155, 166

[56] References Cited

U.S. PATENT DOCUMENTS

| | | |
|---|---|---|
| 3,370,230 | 2/1968 | Mirat et al. . |
| 4,077,030 | 2/1978 | Helava . |
| 4,107,670 | 8/1978 | Hornak ..................................... 341/150 |
| 4,584,558 | 4/1986 | Maschek et al. . |
| 4,641,130 | 2/1987 | Mastroianni . |
| 4,906,928 | 3/1990 | Gard . |
| 4,998,109 | 3/1991 | LeChevalier ............................. 341/166 |
| 5,146,155 | 9/1992 | Trinh Van et al. . |
| 5,170,166 | 12/1992 | Tanaka et al. . |
| 5,327,138 | 7/1994 | Linnenbrink et al. ................... 341/172 |
| 5,537,115 | 7/1996 | Nagazumi ................................ 341/172 |

*Primary Examiner*—Jeffrey A. Gaffin
*Assistant Examiner*—Jason L. W. Kost
*Attorney, Agent, or Firm*—Frommer Lawrence & Haug LLP; William S. Frommer

[57] ABSTRACT

A multi-range analog-to-digital converter for encoding rundown times into a single channel of pulse width encoded data which may be conveyed to a remote equipment room over a single inexpensive, low quality digital cable. An input charge pulse is divided into multiple charge pulses and rundown times of the divided charge pulses are combined and encoded into a single channel of encoded data. A digital value representation of the input charge pulse is derived from the most accurate rundown times selected from the single channel of encoded data.

15 Claims, 4 Drawing Sheets

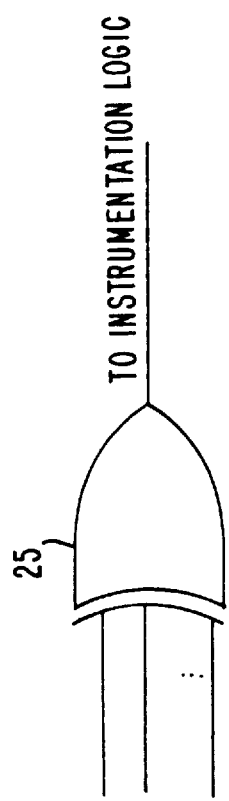
FIG. 2
FIG. 3A
FIG. 3B
FIG. 3C
FIG. 3D

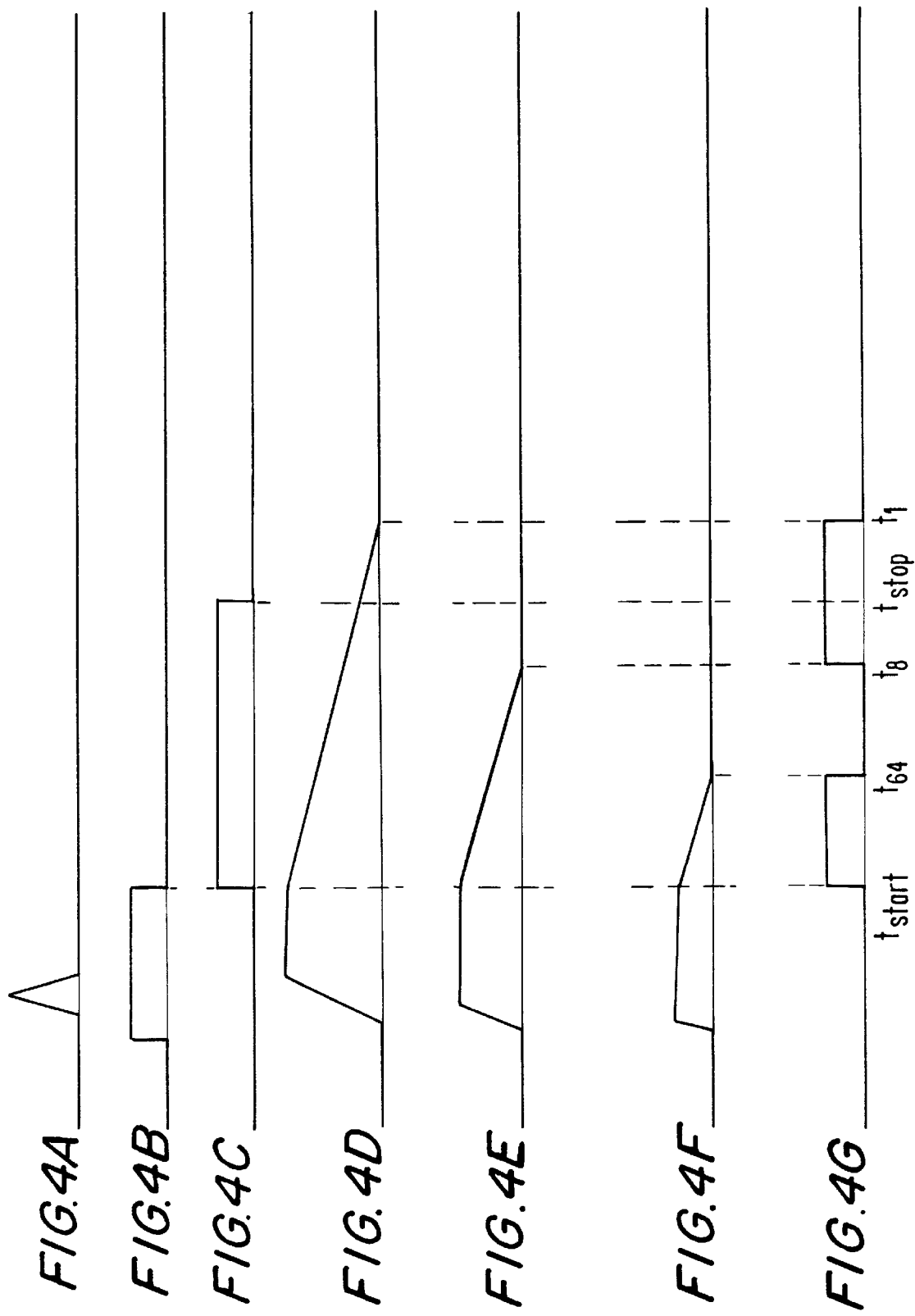

MULTI-RANGE ANALOG-TO-DIGITAL CONVERTER WITH MULTI-RANGE SWITCHING

RELATED APPLICATION

This application claims the benefit of U.S. provisional application No. 60/006,215, filed Nov. 3, 1995.

BACKGROUND OF THE INVENTION

The present invention relates to an analog to digital converter which converts a charge pulse to a digital pulse width encoded data stream and, more particularly, to a charge-to-time converter which is used in connection with electromagnetic calorimeters for detecting sub-atomic particles at colliding beam machines.

The charge integrating analog to digital converter (ADC) has been for many years the preferred instrument for the readout of large calorimeters in high energy and heavy ion physics experiments. The charge integrating technique offers significant advantages over peak sensing or flash ADCs. The total charge usually is directly related to the physical quantity being measured because the charge integrating technique measures the area of the input pulse directly, independent of the pulse shape.

A single range charge ADC generally has been adequate for electromagnetic calorimeters. However, due to the substantial increase in energy of particles under study in recent years, there is a necessity for high resolution wide-dynamic range ADCs, e.g., multi-range ADCs.

The amount of charge in a charge pulse conventionally is converted to a digital value by applying the charge pulse to a capacitor, and measuring the rundown time of the capacitor. The capacitor serves as a charge-to-time converter. When the amount of charge in a pulse can vary over a large range, it is impractical to use only one capacitor. For small pulses, high sensitivity is required, whereas for large pulses, a high sensitivity capacitor will take a long time to rundown.

One technique to provide appropriate sensitivity and reasonable rundown time when the amount of charge in a pulse can vary over a large range is to utilize a set of capacitors. Here, the charge pulse is applied to a set of increasing divider circuits (e.g., /1, /8, /64, . . . ), and each of the divided pulses is applied to a respective capacitor. For a given measuring interval, the longest rundown time within the interval is selected by instrumentation logic as the measurement, and the measurement range is adjusted for the division which was applied to the pulse.

One problem with the above-discussed technique involves the type and amount of cabling that is required to implement the technique. Conventional multi-range converters include costly cabling because detected analog charge pulses are provided directly to a remote equipment room for measurement using expensive analog cabling. The charge pulse originates in an experimental setup, such as a high energy physics wire chamber for detecting particles. The instrumentation electronics, including the instrumentation logic which selects the appropriate capacitor and which adjusts the measurement range, are preferably located in an equipment room that is distant from the experimental setup.

If the charge pulse is to be provided to the equipment room, then one extremely high quality analog cable is required. On the other hand, if the divider circuits are located at the experimental setup, then a set of high quality analog cables are required. If the divider circuits and the capacitors are located at the experimental setup, then a set of lower quality digital cables are required. But, it is desirable to use only one lower quality digital cable to convey rundown information from the capacitors to the instrumentation logic circuit located at the equipment room.

OBJECTS OF THE INVENTION

Therefore, it is an object of the present invention to provide analog to digital converter and corresponding method which overcome the shortcomings of the above-discussed approaches.

Another object of the present invention is to provide analog-to-digital converter which encodes rundown times into a single channel of encoded data.

A further object of this invention is to provide an apparatus and technique as aforesaid, which convey one channel of encoded data to a remote equipment room over a single inexpensive digital cable.

Various other objects, advantages and features of the present invention will become readily apparent from the ensuing detailed description, and the novel features will be particularly pointed out in the appended claims.

SUMMARY OF THE INVENTION

In accordance with this invention, apparatus and method are provided for converting an input charge pulse to a digital pulse width encoded data stream, dividing the input charge pulse into a plurality of divided charge pulses having different pulse levels, generating rundown timing data representing the amount of charge in each of the divided charge pulses, and combining and encoding the rundown timing data into one channel of encoded data. The most accurate rundown timing data is selected from the encoded data and a digital value representation of the input charge pulse is determined as a function of the selected rundown timing data.

As an aspect of this invention, the rundown timing data are generated and coded into one channel of encoded data at one location and the most accurate rundown timing data is selected at another location. The encoded data are then conveyed to the second location over a low quality digital cable.

As another aspect of this invention, the most accurate rundown timing data is selected by detecting edges corresponding to the rundown timing data associated with each divided charge pulses, storing rundown times associated with at least one edge detected within a predetermined interval, counting the number of edges detected within the predetermined interval, and determining a digital value representation of the input charge pulse as a function of the stored rundown timing data and the number of detected edges within the predetermined interval.

BRIEF DESCRIPTION OF THE DRAWINGS

The following detailed description, given by way of example, and not intended to limit the present invention solely thereto, will best be understood in conjunction with the accompanying drawings, wherein like reference numerals denote like elements and parts, in which:

FIG. 2 is a circuit diagram of an exclusive OR gate which combines various rundown times into one channel of data;

FIG. 3A–3D are timing diagrams to which reference will be made in describing the operation of exclusive OR gate 25 of FIG. 2;

FIGS. 4A–4G are timing diagrams to which reference will be made in describing the operation of the instrumentation logic circuit of FIG. 1.

DETAILED DESCRIPTION OF PREFERRED EMBODIMENTS

Figure 1:
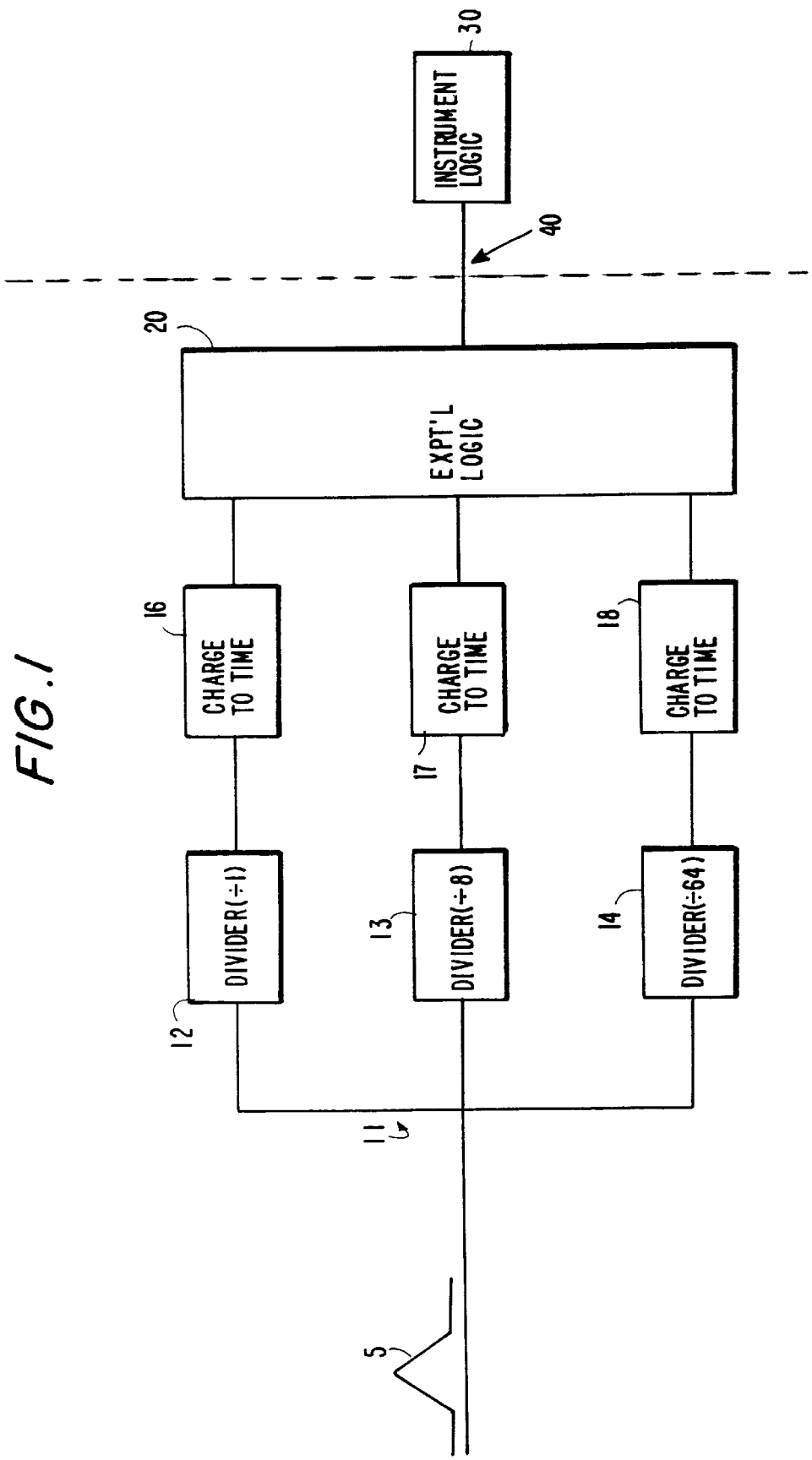
FIG. 1 is a schematic block diagram of a multi-range analog-to-digital converter in accordance with the present invention.

Referring now to the drawings, FIG. 1 illustrates a multi-range analog-to-digital converter 10 in accordance with the present invention and which is used in connection with electromagnetic calorimeters for detecting sub-atomic particles at colliding beam machines. As illustrated, the multi-range analog-to-digital converter is comprised of divider circuits 12–14, charge-to-time converters 16–18, an experimental logic circuit 20, and an instrumentation logic circuit 30.

An analog charge pulse 5 is supplied in common over analog transmission line 11 to an array of parallel dividers 12–14, each of which is comprised of conventional pulse level dividing circuitry. The divider circuit 12 maintains the original charge level of the charge pulse 5, the divider circuit 13 "divides" charge pulse 5 by 8 to produce a pulse level that is; one-eighth of the original level of charge pulse 5, and the divider circuit 14 divides charge pulse 5 by 64 to produce a pulse level that is one sixty-fourth of the level of charge pulse 5. The divisors of the divider circuits 12–14 (i.e., divide by 1, 8 and 64) are given by way of example only; and these values may be adjusted or changed depending on the anticipated amplitude and pulse width of the input charge pulse, and also depending on the particular characteristics of the experiment to which the present invention is applied.

Each of the "divided" charge pulses output from the divider circuits 12–14 is supplied to a respectively different charge-to-time converter 16–18, which may be Wilkinson type charge-to-time converters or other suitable charge-to-time converters. As is seen, providing parallel divider circuits with different divisors prior to the charge to time converters allows a series of ranges of charge pulses to be measured; and the measurements of the charge pulses in these different ranges are made simultaneously. The most appropriate range (or ranges) is selected digitally after the completion of the charge to time conversions (to be discussed).

The charge-to-time converters 16–18 generate "rundown" information for the pulses respectively supplied from the divider circuits 12–14. Each charge-to-time converter includes a capacitor therein that is charged by the "divided" pulse supplied thereto and the capacitor of each converter is linearly discharged to provide a rundown time that is proportional to the amount of charge in the pulse supplied to the respective charge-to-time converter.

The respective rundown times generated in and output from the charge-to-time converters 16–18 are combined in the experimental logic circuit 20 into a single transmission channel. The experimental logic circuit 20 is comprised of an exclusive OR (XOR) gate circuit 25, shown in FIG. 2, which has the same number of inputs as the number of the charge-to-time converters 16–18, and wherein the rundown time output from each charge-to-time converter is supplied to a respective input of the XOR gate circuit 25. FIGS. 3A–3C are exemplary waveforms of the rundown times output from the charge-to-time converters 16–18, respectively, and FIG. 3D illustrates the waveform output by the XOR gate circuit 25 when the waveforms of FIGS. 3A–3C are supplied thereto. As is shown, the charge-to-time converter 16 has the longest rundown time (FIG. 3A), the charge-to-time converter 18 has the shortest rundown time (FIG. 3C) and the charge-to-time converter 17 has a rundown time (FIG. 3B) between the rundown times of the charge-to-time converters 16 and 18. The XOR gate circuit 25 produces from the supplied pulses a pulse-width encoded data stream, as shown in FIG. 3D. It will seen that since the first leading edge of the encoded output of the XOR gate circuit 25 is spurious, it is ignored (to be discussed).

Returning to FIG. 1, after the logic circuit 20 encodes the various rundown times into one channel of data, the encoded rundown times are transmitted via a cable 40 to instrumentation logic circuit 30. The dashed vertical line in FIG. 1 represents that the instrumentation logic circuit 30 is remote from the logic circuit 20. For example, the experimental logic circuit 20 along with the divider circuits 12–14 and the charge-to-time converters 16–18 may be located at or near an experiment set-up site, such as a high-energy physics wire chamber for detecting sub-atomic particles, and the instrumentation logic circuit 30 may be located in an equipment room that is located away from the experiment set-up site.

The experimental logic circuit 20 transmits the encoded rundown time data to the instrumentation logic circuit 30 via a single low quality digital cable. As is well known, "low quality" digital cable generally refers to a digital cable in which the amount of electromagnetic shielding and protection against signal amplitude loss are not critical parameters, which is in contrast to high quality analog cables. The use of a low quality digital cable in the present invention allows the present system to be constructed more cheaply than conventional analog-to-digital converters, which use more expensive high quality analog cables to transmit the respective analog rundown times to a remote instrumentation room. The use of such high quality, expensive analog cables is necessary in such conventional analog-to-digital converters because these converters do not convert the charge into an encoded data stream prior to supplying the information to the instrumentation logic circuit.

The instrumentation logic circuit 30 to which the encoded pulse width data stream is transmitted is comprised of a remote data acquisition rack and selects the most accurate rundown time included in the transmitted encoded data stream. The selected rundown time is converted to a digital value which, together with information detailing the selected charge to time converter (to be discussed), is output as the digital value representation of charge pulse 5.

FIGS. 4A–4G are exemplary waveforms of the various signals of the present application and which will be referred to herein to describe the operation of the present invention. FIG. 4A is a waveform of charge pulse 5 that is applied to the apparatus of FIG. 1, as previously discussed. FIG. 4B illustrates a GATE signal during which the charge pulse of FIG. 4A is integrated, wherein the rundown time starts at the trailing edge of the GATE signal of FIG. 4B. It will be appreciated that the rundown times may be staggered or started with a separate signal. FIG. 4C illustrates a measurement interval in accordance with the present invention, the duration of which is predefined to be longer than the maximum non-saturated rundown time, but smaller than any saturated rundown time. Thus, given a charge pulse of a particular magnitude, the measurement interval of FIG. 4C segregates the rundown times into two groups: (1) those that result from the charge-to-time converters that are in a linear (non-saturated) mode of operation and (2) those that result from the charge-to-time converters that are in a non-linear (saturated) mode of operation. FIGS. 4D–4F illustrate the rundown times supplied from charge-to-time converters 16–18, respectively, previously discussed.

As previously discussed with reference to FIGS. 3A–3D, the experimental logic circuit 20 generates an encoded pulse width data stream that is representative of the various rundown times generated by the aforementioned array of divider circuits. FIG. 4G is a waveform of the encoded data stream. In accordance with the present invention, the instrumentation logic circuit 30 counts the number of pulse edges that occur within the measurement interval shown in FIG. 4C to determine which pulse edge corresponds to which charge-to-time converter and, thus, which "division" was previously applied to which edge. Pulse edges that arrive outside the measurement interval are disregarded by the instrumentation logic circuit 30 because such pulse edges correspond to rundown times that cannot provide an accurate representation of the amount of charge in the charge pulse since they are produced by charge-to-time converters that are in a non-linear (saturated) mode of operation. Charge-to-time converters operating in the saturated region have inaccurate rundown times.

The instrumentation logic circuit 30 stores therein the time of the last edge that occurs within the measurement interval as measured from the beginning of the measurement interval, and adjusts the stored time value in accordance with the division that was applied to it to produce a digital value which represents the amount of charge in charge pulse 5. The last edge occurring within the measurement interval is used because it is the most accurate measurement of the charge pulse. In the exemplary waveforms of FIGS. 4A–4G, the last edge that occurs within the measurement interval corresponds to the rundown time from the charge-to-time converter 17, which received a pulse divided by a factor of 8. Accordingly, the instrumentation logic circuit 30 adjusts for this division by multiplying time $t_8$ by a factor of 8 in order to produce a digital value corresponding to the amount of charge in charge pulse 5.

Alternatively, instead of storing only the last edge that occurs within the measurement interval, the instrumentation logic circuit is programmed to use the last two (or more) edges that occur within the measurement interval; and the instrumentation logic circuit generates a weighted average of these two signals in order to provide a smooth transition between different ranges.

Figure 5:
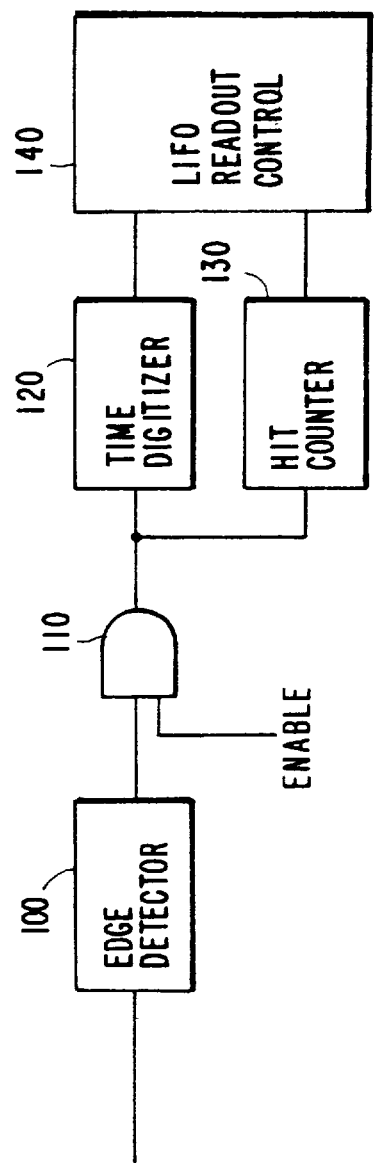
FIG. 5 is a schematic block diagram of the instrumentation logic circuit of FIG. 1.

FIG. 5 is a block diagram of the instrumentation logic circuit 30. As illustrated, the instrumentation logic circuit 30 is comprised of an edge detector 100, a time digitizer 120, a hit counter 130, and a LIFO readout control circuit 140.

The pulse width encoded data stream (FIG. 4G) is supplied to edge detector 100, which detects the edges in the data stream, each edge corresponding to a respective rundown time. Each detected edge is supplied to an AND gate circuit 110, and an ENABLE signal which corresponds to the above-described measurement interval, also is supplied to the AND gate circuit 110. As previously discussed, the ENABLE signal causes the instrumentation logic circuit 30 to disregard those edges that occur outside the measurement interval. The edges that are detected within the measurement interval are supplied to both the time digitizer 120 and the hit counter 130. The time digitizer 120 stores the last edge received within the measurement interval, and the hit counter 130 counts the number of edges occurring in this measurement interval. Alternatively, the time digitizer 120 can be constructed to store more than one edge; such plural edges can then be weighted and averaged during subsequent processing by the LIFO readout control circuit 140. In the example of FIGS. 4A–4G, the hit counter 130 registers a value of 2 since only two edges are received by the edge detector 100 within the predetermined measurement interval. The stored rundown times and the hit count are supplied to the LIFO readout control circuit 140, which may be comprised of a programmed microprocessor. The LIFO readout control circuit 140 utilizes the last rundown time received within the measurement interval to calculate the digital value representation of charge pulse 5 and utilizes the hit count to determine the division that was applied to the last-received edge. For example, and as shown in FIGS. 4A–4G, two edges are received within the measurement interval, thus causing the hit counter 130 to supply a value of 2 to the LIFO readout control circuit 140. The LIFO readout control circuit 140 is pre-programmed to recognize that a hit count of two indicates that the last edge received corresponds to a rundown time that was divided by a factor of 8. The LIFO readout control circuit 140 then adjusts the rundown time in accordance with this division factor to produce a digital value that represents the amount of charge in charge pulse 5 in the manner previously discussed.

While the present invention has been particularly shown and described with reference to a preferred embodiment, it will be readily appreciated that various changes may be made without departing from the spirit and scope of the invention. For example, the number of divider circuits and charge-to-time converters are not limited to three and can be any practical number greater than three.

It is intended that the appended claims be interpreted to include the embodiments discussed above, those various alternatives which have been described and all equivalents thereto.

What is claimed is:

1. A multi-range analog-to-digital converter, comprising:
   a plurality of dividers for dividing a single input charge pulse by respectively different amounts to produce a plurality of divided charge pulses;
   a plurality of charge-to-time converters for converting each of said divided charge pulses to respective rundown timing data, each of said rundown timing data representing an amount of charge in a respective one of said divided charge pulses;
   means for encoding said rundown timing data into one channel of encoded data;
   means for selecting one of said rundown timing data from said one channel of encoded data; and
   means for converting the selected rundown timing data to a value representing an amount of charge in said input charge pulse.

2. The converter of claim 1, wherein said means for selecting includes:
   means for detecting edges of said channel of encoded data corresponding to said rundown timing data generated by each of said plurality of charge-to-time converters;
   means for supplying said edges detected within a predetermined interval;
   means for storing the rundown timing data associated with at least one supplied edge detected within the predetermined interval; and
   means for counting the number of edges detected within the predetermined interval to provide a count number;
   and wherein said means for converting converts said rundown timing data stored in said means for storing to a digital value representing said amount of charge in the input charge pulse in accordance with the count number.

3. The converter of claim 2, wherein said means for storing is operable to store the rundown timing data associated with a last one of the supplied edges detected within the predetermined interval.

4. The converter of claim 2, wherein said means for storing is operable to store the rundown timing data associated with a last two of the supplied edges; and said means for converting converts the stored rundown timing data to the amount of charge of the input charge pulse in accordance with a weighted average of each rundown timing data stored in said means for storing.

5. The converter of claim 1, further comprising a low quality digital cable for supplying said one channel of encoded data to a remote location from said dividers, charge-to-time converters and means for encoding; and wherein said means for selecting is located at said remote location.

6. The converter of claim 1, wherein said means for encoding is an exclusive OR circuit.

7. The converter of claim 1, wherein said means for encoding is operable to encode said rundown timing data into a single channel of pulse width encoded data.

8. The converter of claim 1, wherein each of said charge-to-time converters includes a capacitor which is charged by a respective divided charge pulse and which is linearly discharged to provide respective rundown timing data that represents an amount of charge in said respective divided charge pulse.

9. A method for detecting an amount of charge in a pulse, comprising the steps of:

receiving a pulse;

dividing a level of the received pulse by respectively different values to produce a plurality of divided pulses;

generating rundown timing data for each of said plurality of divided pulses, wherein each of said rundown timing data represents an amount of charge in a respective one of said divided pulses;

encoding said rundown timing data into one channel of encoded data;

selecting one of said rundown timing data from said one channel of encoded data; and converting the selected rundown timing data to a value representing an amount of charge in the received pulse.

10. The method of claim 9, wherein the step of selecting includes:

detecting edges of said channel of encoded data corresponding to said rundown timing data generated by each of said plurality of divided pulses;

storing the rundown timing data associated with at least one edge detected within a predetermined interval;

counting the number of edges detected within the predetermined interval to provide a count number; and converting said stored rundown timing data to a digital value representing said amount of charge in said received pulse in accordance with the count number.

11. The method of claim 10, wherein the stored rundown timing data is associated with a last edge detected within the predetermined interval.

12. The method of claim 10, wherein the stored rundown timing data is associated with the last two of the supplied edges and wherein the step of converting converts the stored rundown timing data to the amount of charge in said received pulse in accordance with a weighted average of each stored rundown timing data.

13. The method of claim 9, further comprising the step of providing said one channel of encoded data to a remote location over a low quality digital cable; and wherein the step of selecting is performed in said remote location.

14. Apparatus for detecting an amount of charge in a pulse, comprising:

means for receiving a pulse;

a plurality of dividers for dividing a level of the received pulse by respectively different values to produce a plurality of divided pulses;

means for converting an amount of charge of each of the divided pulses to respective time signals;

means for encoding the time signals into a pulse coded signal having edges each representing a respective one of the time signals;

means for selecting one of the edges of said pulse coded signal; and means for converting a time corresponding to the selected edge of said pulse coded signal to a charge amount representing an amount of charge in the received pulse.

15. The apparatus of claim 14, wherein said means for selecting includes:

means for detecting each of said edges of said pulse coded signal;

means for selecting at least one of the detected edges occurring within a predetermined interval of time;

means for counting the number of edges detected within the predetermined interval to provide a count number, and wherein each of said plurality of dividers corresponds to a unique count number; and wherein said means for converting converts rundown timing data corresponding to the selected detected edge to the charge amount in accordance with a divider value associated with a divider corresponding to the count number.

* * * * *